United States Patent
Floman et al.

(10) Patent No.: US 8,671,240 B2
(45) Date of Patent: Mar. 11, 2014

(54) USER SELECTABLE BALANCE BETWEEN DENSITY AND RELIABILITY

(75) Inventors: Matti Floman, Kangasala (FI); Kimmo Mylly, Ylojarvi (FI)

(73) Assignee: Memory Technologies LLC, Kirkland, WA (US)

( * ) Notice: Subject to any disclaimer, the term of this patent is extended or adjusted under 35 U.S.C. 154(b) by 118 days.

(21) Appl. No.: 13/184,885

(22) Filed: Jul. 18, 2011

(65) Prior Publication Data
US 2013/0024601 A1    Jan. 24, 2013

(51) Int. Cl.
*G06F 12/16* (2006.01)
(52) U.S. Cl.
USPC .................... 711/103; 711/170; 711/E12.008
(58) Field of Classification Search
USPC .................................... 711/103, 170, E12.008
See application file for complete search history.

(56) References Cited

U.S. PATENT DOCUMENTS

| | | | | |
|---|---|---|---|---|
| 6,167,482 | A | 12/2000 | Schmidt et al. | 711/103 |
| 6,558,967 | B1 * | 5/2003 | Wong | 438/17 |
| 2002/0054504 | A1 | 5/2002 | Micheloni et al. | 365/185.03 |
| 2005/0066206 | A1 | 3/2005 | Beers et al. | 713/320 |
| 2005/0273548 | A1 * | 12/2005 | Roohparvar | 711/103 |
| 2005/0273549 | A1 | 12/2005 | Roohparvar | 711/103 |
| 2005/0286297 | A1 | 12/2005 | Roohparvar | 365/185.03 |
| 2008/0198651 | A1 * | 8/2008 | Kim | 365/185.03 |
| 2008/0316812 | A1 | 12/2008 | Roohparvar | 365/185.03 |
| 2009/0100244 | A1 | 4/2009 | Chang et al. | 711/172 |
| 2009/0259799 | A1 | 10/2009 | Wong | 711/103 |
| 2010/0174852 | A1 * | 7/2010 | Chien et al. | 711/103 |

FOREIGN PATENT DOCUMENTS

KR        20100110651 A1    10/2010

OTHER PUBLICATIONS

JEDEC Standard, Embedded Multi-Media Card (E-MMC), Electrical Standard (4.5 Device), JESD84-B45, (Jun. 2011), (248 pages).

* cited by examiner

*Primary Examiner* — Hal Schnee
(74) *Attorney, Agent, or Firm* — Lee & Hayes, PLLC (57) ABSTRACT

A method for enabling users to select a configuration balance for a memory device is described. The method includes receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The method also includes determining a new configuration for each of the selected one or more memory cells. For each of the selected one or more memory cells, the configuration of the memory cell is changed from the current configuration to the determined new configuration. Apparatus and computer readable media are also disclosed.

14 Claims, 4 Drawing Sheets

USER SELECTABLE BALANCE BETWEEN DENSITY AND RELIABILITY

TECHNICAL FIELD

The exemplary and non-limiting embodiments of this invention relate generally to memory devices and, more specifically, relate to providing users an option to select a balance between memory density and memory reliability for a memory device.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:
eNB E-UTRAN Node B (evolved Node B)
e-MMC embedded multi-media card
FW firmware
HDD hard drive
HW hardware
MLC multi-level cell
Node B base station
OTP one-time programmable
PE program-erase
SLC single-level cell
SW software
UE user equipment, such as a mobile station or mobile terminal Mobile devices, such as UEs, may use memory for storing user data, for example, music, pictures, applications, maps, etc. The amount of user data stored in mobile devices is increasing and will continue to grow. Some high-end devices provide user data storage based on non-volatile memory such as NAND memory technology (also known as flash memory). NAND memory usage has expanded to mid-range devices.

Many products have more memory included than what is strictly needed for basic usage. People are also using this extra memory on their phones to store critical data, for example, business related data, personal pictures, notes, etc.

One reason for the success of NAND memory is its cost structure. However, due to cost pressures for higher densities, more bits are being stored per memory cell. Storing multiple bits per cell allows a device to hold greater amounts of data at a lower cost structure, but at the expense of the reliability of the cell.

A few parameters affecting NAND memory reliability include:
Manufacturing process used (newer processes allowing small physical dimensions which may have lower reliability)
Number of bits per cell (multiple voltage levels per cell may cause lower reliability)
Number of the times that a memory cell has been rewritten (During a cycle, the cell is erased and rewritten. A higher number of cycles causes lower reliability, e.g., for a floating gate technology there will be more electrons trapped in the insulating layer.)
Time between write and read (retention of cycled memory is lower)
Temperature (NAND retention in high temperatures is lower)

A NAND memory's reliability may reach levels where heavy use can wear out the device within a few years. An additional challenge for NAND cells is that if a user cycles the memory heavily at the begin of their usage then the memory may no longer be able to store its data for as long a period of time than if the memory cell had been cycled only a few times. Higher data reliability for a NAND based storage device is available when the storage has been cycled a minimum number of times.

The smaller the process used for manufacturing the cell the smaller the physical dimensions are. This results in higher interference between cells as they are closer to each other. Additionally, as there is a thinner insulating material layer around the floating gate electrons may escape easier and fewer electrons will fit into the floating gate. Thus, if even one electron escapes, it represents a higher percentage of the electrons in the cell as compared to previous processes.

Users who do not cycle their data as much might appreciate an option to have increased density available for their non-critical data. For other users the safety of their data is more important.

While it may sound drastic to make a selection between reliability and density, this is what users and manufacturers do when deciding which memory cards to purchase. For example, memory cars that are based on multi-bit per cell technologies may provide greater density. On the other hand, the more bits there are per cell the lower the reliability may be.

For personal computers, a hard drive (HDD) could compress its content for increased density. Such an operation may be performed by software (SW). This technique did not store more data on a hardware (HW) level; rather, the data was packaged at a software level to be smaller image. Additionally, HDD technology may not experience a similar reliability drop due to cycling or storage time to that seen in NAND devices.

Some NAND based memories may have a factory-set option as to which portion of the multi-level cell (MLC) NAND (e.g., where two or more voltage levels are used for one cell value) where is to be used as a single-level cell (SLC) NAND. As a MLC has a lower reliability and performance, using this factory setup, the mass storage can provide improved reliability for one portion of the memory and at the same time performance for this part of the memory is also increased. The cost of this is that the available density is reduced since the portion used as SLC has less density than if it were be used as MLC.

In the eMMC standard, it is possible to set partition characteristics for a memory medium (either for the whole media or for part of it), such as, normal vs. enhanced (which impacts the density) or system data vs. "volatile" data (related to the retention time of the data). This method does not provide flexible scaling as this setting can only be done at the beginning of the usage and it is typically done at the factory.

Another eMMC functionality proposed is dynamic capacity where part of the memory can be defined as available for an eMMC module's internal use. This can include using the cells as additional spare areas, which may extend cycling limits for the rest of the memory. This setting could be done during the lifetime of the eMMC module. This method is based on removing density visible outside the eMMC module for better functionality. However, only removing cells is possible; therefore, the cells removed cannot be returned and made available outside the eMMC module.

In order to mitigate some of the problems caused by memory usage, a wear level process may level cycling over a greater area of the memory. Data stored in the memory is moved to different locations in the memory so that all the cells experience similar cycling levels. The intent is to extend the lifetime of individual cells of the memory; however, at the same time, the reliability of the memory as a whole is also evenly reduced.

Another conventional memory system provides a user configurable density/performance option. Depending on a selectable option, the memory blocks (or a portion of them) are set to MLC (high density with slow performance) or SLC (low density with high performance). However, this conventional memory system does not take into account the wearing of cells due to repeated program-erase (PE) operations.

SUMMARY

The below summary section is intended to be merely exemplary and non-limiting.

The foregoing and other problems are overcome, and other advantages are realized, by the use of the exemplary embodiments of this invention.

In a first aspect thereof an exemplary embodiment of this invention provides a method for enabling users to select a configuration balance for a memory device. The method includes receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The method also includes determining a new configuration for each of the selected one or more memory cells. For each of the selected one or more memory cells, the configuration of the memory cell is changed from the current configuration to the determined new configuration.

In another aspect thereof an exemplary embodiment of this invention provides an apparatus for enabling users to select a configuration balance for a memory device. The apparatus includes one or more processors; and one or more memories including computer program code, the one or more memories and the computer program code configured to, with the one or more processors, cause the apparatus to perform actions. The actions include receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The actions also include determining a new configuration for each of the selected one or more memory cells. For each of the selected one or more memory cells, the configuration of the memory cell is changed from the current configuration to the determined new configuration.

In a further aspect thereof an exemplary embodiment of this invention provides a computer readable medium for enabling users to select a configuration balance for a memory device. The computer readable medium is tangibly encoded with a computer program executable by a processor to perform actions. The actions include receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The actions also include determining a new configuration for each of the selected one or more memory cells. For each of the selected one or more memory cells, the configuration of the memory cell is changed from the current configuration to the determined new configuration.

In another aspect thereof an exemplary embodiment of this invention provides an apparatus for enabling users to select a configuration balance for a memory device. The apparatus includes means for receiving an indication of a memory configuration for a mass memory including two or more of memory cells. Means for selecting one or more memory cells of the mass memory based at least in part on 1) the indication, 2) a current configuration for each of the one or more memory cells and 3) a program-erase count for each of the one or more memory cells is also included. The apparatus also includes means for determining a new configuration for each of the selected one or more memory cells. Means for changing, for each of the selected one or more memory cells, the configuration of the memory cell from the current configuration to the determined new configuration is also included.

BRIEF DESCRIPTION OF THE DRAWINGS

The foregoing and other aspects of exemplary embodiments of this invention are made more evident in the following Detailed Description, when read in conjunction with the attached Drawing Figures, wherein.

DETAILED DESCRIPTION

What is needed is a way for a user to guide how a mass memory balances between reliability and density which takes into consideration cell wear caused by repeated PE operations.

Various exemplary embodiments in accordance with this invention provide a user with a technique to flexibly configure a memory of a device (e.g., a NAND memory of a mobile phone) according to their needs. The user may choose between different levels of configuration based on their data storage preferences such as, maximum reliability, maximum density, or a balance between reliability and density, etc. The configuration of the memory cells will then be adjusted based, at least in part, on the amount of wear caused by repeated erase-program operations already experienced by the cells.

The term "density" may refer to the total amount of memory available at a given time and "capacity" may refer to the overall ability of the memory to store data over a lifetime of the memory (for example, a function of density and allowed PE cycles).

Figure 1:
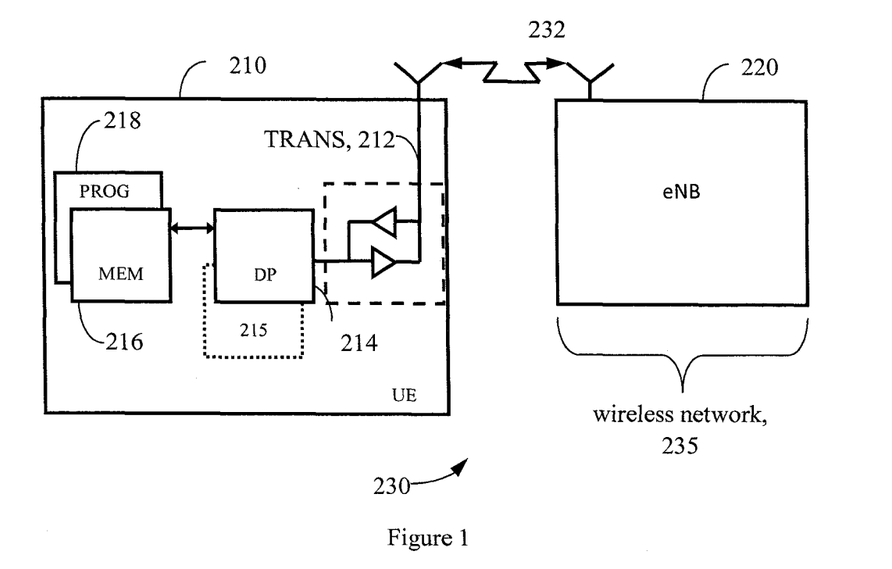
FIG. 1 shows a simplified block diagram of exemplary electronic devices that are suitable for use in practicing various exemplary embodiments of this invention.

Before describing in further detail various exemplary embodiments of this invention, reference is made to FIG. 1 for illustrating a simplified block diagram of various electronic devices and apparatus that are suitable for use in practicing exemplary embodiments of this invention.

In the wireless system 230 of FIG. 1, a wireless network 235 is adapted for communication over a wireless link 232 with an apparatus, such as a mobile communication device which may be referred to as a UE 210, via a network access node, such as a Node B (base station), and more specifically an eNB 220.

The UE 210 includes a controller, such as a computer or a data processor (DP) 214, a computer-readable memory medium embodied as a memory (MEM) 216 that stores a program of computer instructions (PROG) 218, and a suitable wireless interface, such as radio frequency (RF) transceiver 212, for bidirectional wireless communications with the eNB 220 via one or more antennas. The UE 210 may also include one or more dedicated processors, for example memory processor 215.

The PROGs 218 is assumed to include program instructions that, when executed by the associated DP 214, enable the device to operate in accordance with exemplary embodiments of this invention, as will be discussed below in greater detail.

That is, various exemplary embodiments of this invention may be implemented at least in part by computer software executable by the DP 214 of the UE 210, or by hardware, or by a combination of software and hardware (and firmware).

In general, the various embodiments of the UE 210 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions. Additional electronic devices and apparatus that are suitable for use in practicing exemplary embodiments of this invention may (or may not) include a wireless interface.

The computer readable MEM 216 may be of any type suitable to the local technical environment and may be implemented using any suitable data storage technology, such as semiconductor based memory devices, flash memory, magnetic memory devices and systems, optical memory devices and systems, fixed memory and removable memory. The DP 214 may be of any type suitable to the local technical environment, and may include one or more of general purpose computers, special purpose computers, microprocessors, digital signal processors (DSPs) and processors based on a multicore processor architecture, as non-limiting examples. The wireless interface (e.g., RF transceiver 212) may be of any type suitable to the local technical environment and may be implemented using any suitable communication technology such as individual transmitters, receivers, transceivers or a combination of such components.

Figure 2:
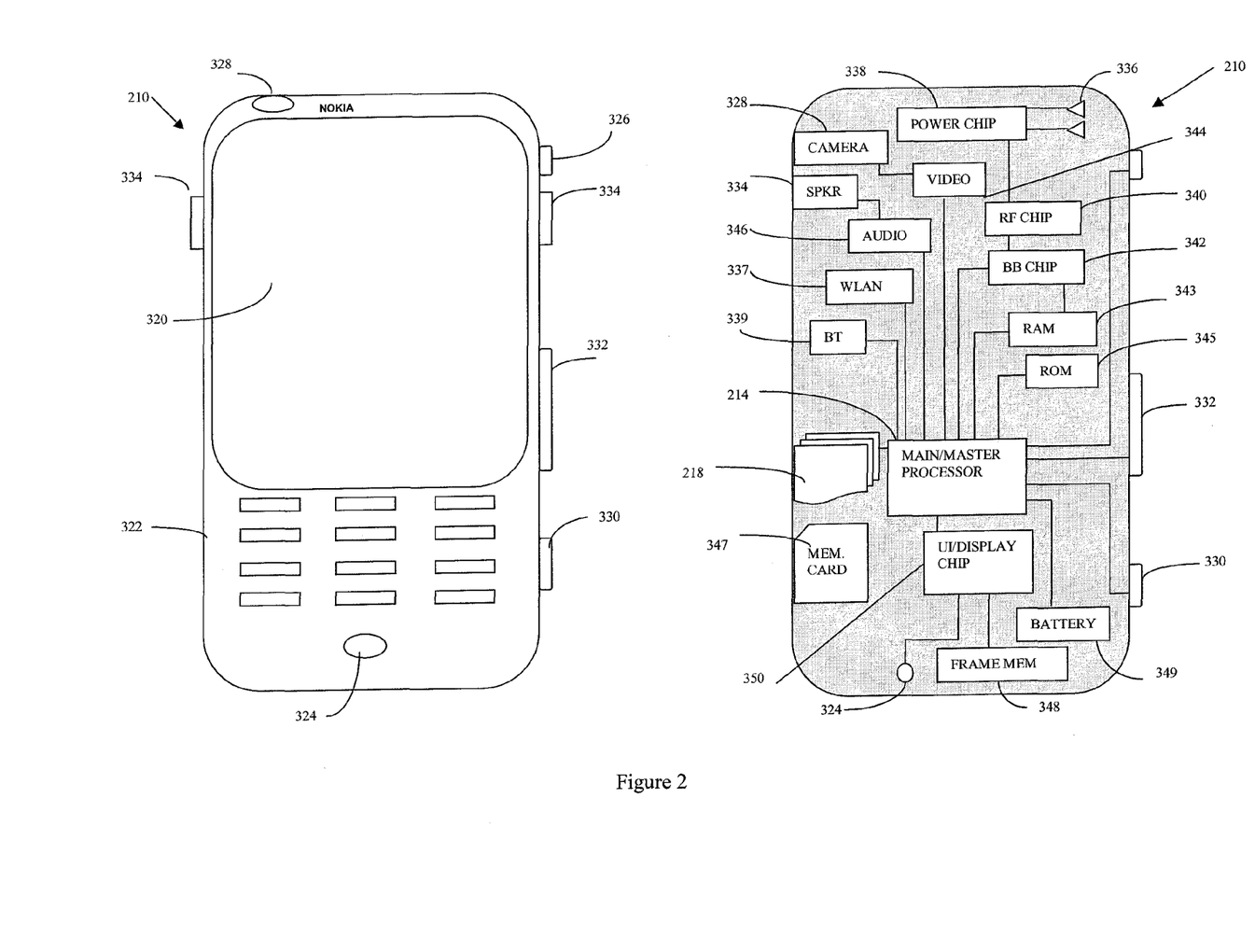
FIG. 2 shows a more particularized block diagram of an exemplary user equipment such as that shown at FIG. 1.

FIG. 2 illustrates further detail of an exemplary UE in both plan view (left) and sectional view (right), and the invention may be embodied in one or some combination of those more function-specific components. At FIG. 2 the UE 210 has a graphical display interface 320 and a user interface 322 illustrated as a keypad but understood as also encompassing touch-screen technology at the graphical display interface 320 and voice-recognition technology received at the microphone 324. A power actuator 326 controls the device being turned on and off by the user. The exemplary UE 210 may have a camera 328 which is shown as being forward facing (e.g., for video calls) but may alternatively or additionally be rearward facing (e.g., for capturing images and video for local storage). The camera 328 is controlled by a shutter actuator 330 and optionally by a zoom actuator 332 which may alternatively function as a volume adjustment for the speaker(s) 334 when the camera 328 is not in an active mode.

Within the sectional view of FIG. 2 are seen multiple transmit/receive antennas 336 that are typically used for cellular communication. The antennas 336 may be multi-band for use with other radios in the UE. The operable ground plane for the antennas 336 is shown by shading as spanning the entire space enclosed by the UE housing though in some embodiments the ground plane may be limited to a smaller area, such as disposed on a printed wiring board on which the power chip 338 is formed. The power chip 338 controls power amplification on the channels being transmitted and/or across the antennas that transmit simultaneously where spatial diversity is used, and amplifies the received signals. The power chip 338 outputs the amplified received signal to the radio-frequency (RF) chip 340 which demodulates and downconverts the signal for baseband processing. The baseband (BB) chip 342 detects the signal which is then converted to a bit-stream and finally decoded. Similar processing occurs in reverse for signals generated in the apparatus 210 and transmitted from it.

Signals to and from the camera 328 pass through an image/video processor 344 which encodes and decodes the various image frames. A separate audio processor 346 may also be present controlling signals to and from the speakers 334 and the microphone 324. The graphical display interface 320 is refreshed from a frame memory 348 as controlled by a user interface chip 350 which may process signals to and from the display interface 320 and/or additionally process user inputs from the keypad 322 and elsewhere.

Certain embodiments of the UE 210 may also include one or more secondary radios such as a wireless local area network radio WLAN 337 and a Bluetooth® radio 339, which may incorporate an antenna on-chip or be coupled to an off-chip antenna. Throughout the apparatus are various memories such as random access memory RAM 343, read only memory ROM 345, and in some embodiments removable memory such as the illustrated memory card 347. The various programs 218 are stored in one or more of these memories. All of these components within the UE 210 are normally powered by a portable power supply such as a battery 349.

Processors 338, 340, 342, 344, 346, 350, if embodied as separate entities in a UE 210, may operate in a slave relationship to the main processor 214, which may then be in a master relationship to them. Embodiments of this invention are most relevant to the the memory modules (216, 338, 340, 347) and processors used to control the memory (e.g, DP 214 and controllers of the memory modules (216, 338, 340, 347), though it is noted that other embodiments need not be disposed there but may be disposed across various chips and memories as shown or disposed within another processor that combines some of the functions described above for FIG. 2. Any or all of these various processors of FIG. 2 access one or more of the various memories, which may be on-chip with the processor or separate therefrom.

Note that the various chips (e.g., 338, 340, 342, etc.) that were described above may be combined into a fewer number than described and, in a most compact case, may all be embodied physically within a single chip.

Figure 3:
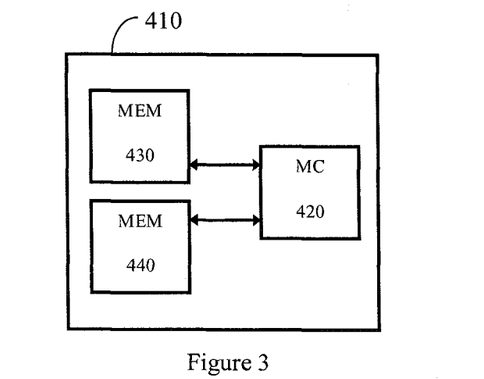
FIG. 3 shows a more particularized block diagram of an exemplary memory device such as that shown at FIGS. 1 and 2.

FIG. 3 shows a more particularized block diagram of an exemplary memory device such as that shown at FIGS. 1 and 2, e.g., MEM 216, RAM 343, ROM 345 and memory card 347. MEM 410 includes a memory controller (MC) 420 and, as shown, two individual memory units MEM 430 and MEM 440. In another exemplary embodiment, there may be one or more memory units. MC 420 is configured to handle read/write requests and send instructions to MEM 430 and MEM 440 accordingly.

MEM 430 and MEM 440 may be the same type of memory device (e.g., both using NAND memory technology) or they may be of different types (e.g., MEM 430 may use NAND memory technology and 440 may be an optical drive memory technology). Additionally, one or more of the memory units (MEM 430, 440) may be used as a local cache memory for the MC 420.

Figure 4:
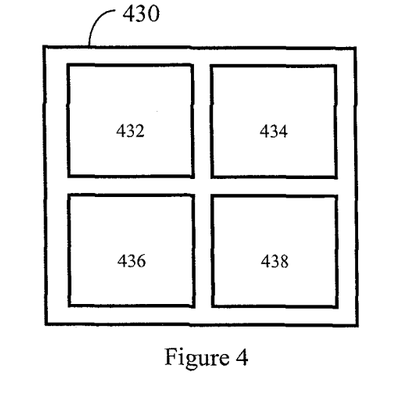
FIG. 4 shows a more particularized block diagram of an exemplary memory unit as that shown at FIG. 3.

FIG. 4 shows a more particularized block diagram of an exemplary memory unit as that shown at FIG. 3. MEM 430 is divided into various memory regions (432, 434, 436 and 438). Four regions are shown as a non-limiting illustration; however, there can be any number of regions (e.g., 1, 2, 4, 8, etc.).

The separation of the regions may be physical or a virtual separation. A virtual separation may be performed by assigning various memory addresses to a region. The cells in a region may or may not be physically contiguous. Each region may be treated separately by the MC 420 or combined into a single entity.

As a non-limiting example, the MEM 430 may be separated into 2 regions, a first region containing cells configured as MLC and a second region containing cells configured as SLC. These regions may be identically sized (representing a 50-50 split) or they may have different sizes (e.g., an 80-20 split, a 75-25 split, etc.).

As noted above, various exemplary embodiments in accordance with this invention provide a user with a technique to flexibly configure a memory of a device (e.g., a NAND memory) according to their needs. The user may choose between different levels of configuration based on their data storage needs such as, maximum reliability, maximum density, or a balance between reliability and density, etc. The configuration of the memory cells will then be adjusted based, at least in part, on the amount of wear caused by repeated PE operations experienced by the cells.

Since the wear on the individual cells is considered it is possible to safely change the configuration a number of times. While making many repeated changes may have an overall negative effect on reliability, it is possible to reverse changes to the memory configuration while having a minimal impact on reliability.

Reliability and density are two selectable properties for a memory device. High reliability may be obtained when a cell is written to only once (e.g., not erased and re-written ever) or when the cell is changed only a limited number of times. For high reliability, the number of PE cycles may be tracked and, once a threshold number of erase cycles for acceptable reliability is reached, the cell is marked as either a one-time programmable (OTP) cell or a non-usable cell.

Additional selectable properties may also be considered. These factors may include power consumption and/or access speed. Thus, there could be a selection between speed and power. In more advanced settings, there could be "a triangle" of density, reliability and speed. The user could move a pointer balancing these three parameters.

In a non-limiting example, the maximum PE cycle per cell (or NAND page/block) may be set by default to 3,000 (as a balance between density and reliability). The user could set the memory for maximum reliability or data retention, e.g., which may coincide with 100 maximum PE cycles per cell, or to maximum density, e.g., 10,000 maximum PE cycles per cell. While the user might not see the actual max PE counts used, host SW/memory controller FW would use the value in flash management to control the memory. With a higher max PE setting the user could write more data to the memory overall and therefore density stays longer allowing greater capacity. With a low PE setting density will start to drop earlier which may reduce the capacity of the memory.

In a non-limiting embodiment, a user can flexibly define limits as to when cells are no longer usable and, as consequence, adjust the balance/emphasis between reliability and density. As one example, the threshold number may be changed to better suit the user's preferences. In some situations, this may result in cells marked as OTP cells or as non-usable cells to be reconfigured. For instance, various non-usable cells may be re-configured as OTP cells when the threshold number is increased.

If an OTP option is used then, after writing data to the cell, that data can be either erased or read but the cell is no longer writable. As a result the maximum density of the device may drop as more and more cells are no longer writable; however, the user can be sure that their data is as safe as possible.

Alternatively, a cell may be marked as non-usable only when failure is considered imminent or once retention time is deemed to be impractically short. This way the memory will provide high density for a longer time even though overall reliability may be lower.

Note that if the user configures the device to have maximum density and then later changes the setting to maximum reliability then the resulting reliability would not likely be the same as if maximum reliability had been selected at the beginning prior to allowing cycling to reduce the NAND cells reliability. However, the reliability may be set at the best level that can be reached with the worn cells.

Host devices may send reliability-density targets to the mass memory's internal controller, so that the mass memory's internal controller can then select how long each cell may be used and/or how each cell is configured (e.g., SLC/MLC). If the mass memory does not use an internal controller the host SW may access the NAND memory's parameters as real-time cycling counters for each cell.

Another exemplary embodiment in accordance with this invention is a user interface (UI) allowing a user to configure/reconfigure their memory device. A UI is displayed, for example, on the display 320 of a host device 210. The UI allows the user to change settings controlling the use of a memory (e.g., MEM 216). Thus, allowing the user to dictate a balance between density and reliability. After receiving the user's selection, the configuration of the memory is adjusted in order to more closely implement the selected settings.

In one non-limiting embodiment, various memory cells or groups of memory cells may be changed from SLC to MLC to increase density or from MLC to SLC to increase reliability. Additionally, the memory cells having their settings changed may be chosen so as to mitigate any potentially negative effects such as by considering the number of PE counts for each cell. For example, SLC cells which have a higher number of PE counts (thus, having a reduced reliability) may be selected to become MLC cells. Likewise, MLC cells which have a lower number of PE counts may be reconfigured as SLC cells. When considering PE counts, the counts may be compared to an average over a portion of the memory (e.g., a region, the entire memory, or those cells having the same configuration) or the PE counts may be compared against a threshold value.

The selection of memory cells to be changed may also consider additional factors, for example, whether data is stored in the memory. As one non-limiting example, MLC memory cells that are not currently storing data (or storing data marked for deletion) may be selected over MLC memory cells storing data.

In another non-limiting example, if a memory cell storing data is selected to be changed to another type of memory cell (e.g., MLC cell to become an SLC cell), the data stored in the cell may be migrated to one or more cells before reconfiguring the selected memory cell.

In one non-limiting embodiment, the user is presented with a limited number of options to choose from when selecting a new configuration for the memory, such as 'high reliability', 'high density', or 'balanced'. Alternatively, the user may be provided with a slider with 'high reliability' on one side and 'high density' on the other. These descriptions may then be translated into functional parameters. In another alternative, the user may select exact numeric values for the target parameters, for example, in an advanced user mode.

In a non-limiting embodiment, the configuration is handled by the host processor (e.g., DP 214 or memory processor 215). Alternatively, the configuration is handled by the memory controller 420.

Figure 5:
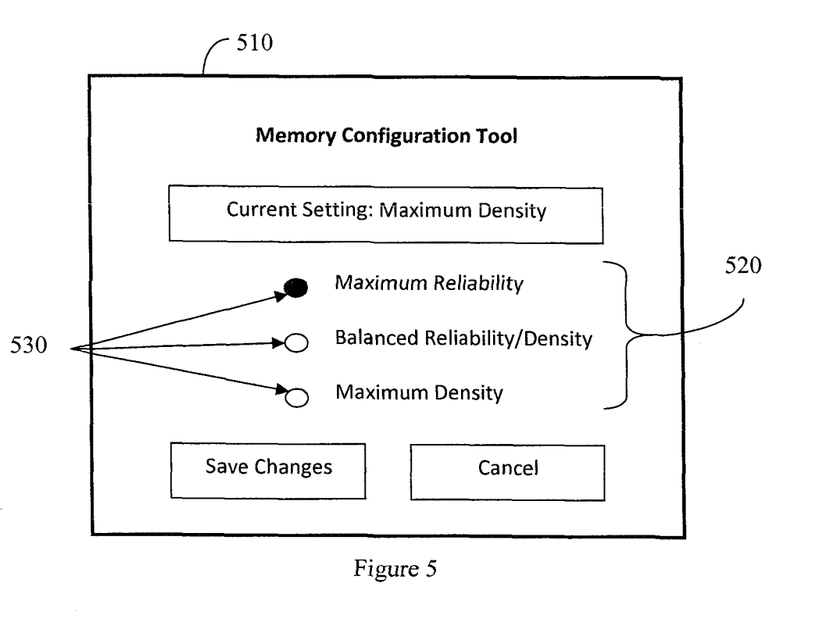
FIG. 5 illustrates a user interface for receiving a memory configuration selection of an exemplary embodiment in accordance with this invention.

FIG. 5 illustrates a user interface for receiving a memory configuration selection of an exemplary embodiment in accordance with this invention. User interface (UI) 510 displays a number of options 520 that the user may select. As shown here, each option is selectable via the buttons 530. Once the user has made their selection, they may enter 'save changes' in order to finalize their selection.

As shown in FIG. 5, the user has made a preliminary selection of "Maximum Reliability". If the user finalizes this choice, the current setting for the memory device will be changed from "Maximum Density" to "Maximum Reliability" (for example, by changing memory cells from MLC to SLC).

Based on the foregoing it should be apparent that the exemplary embodiments of this invention provide a method, apparatus and computer program(s) to enable users to select a balance between memory density and memory reliability for a memory device.

Figure 6:
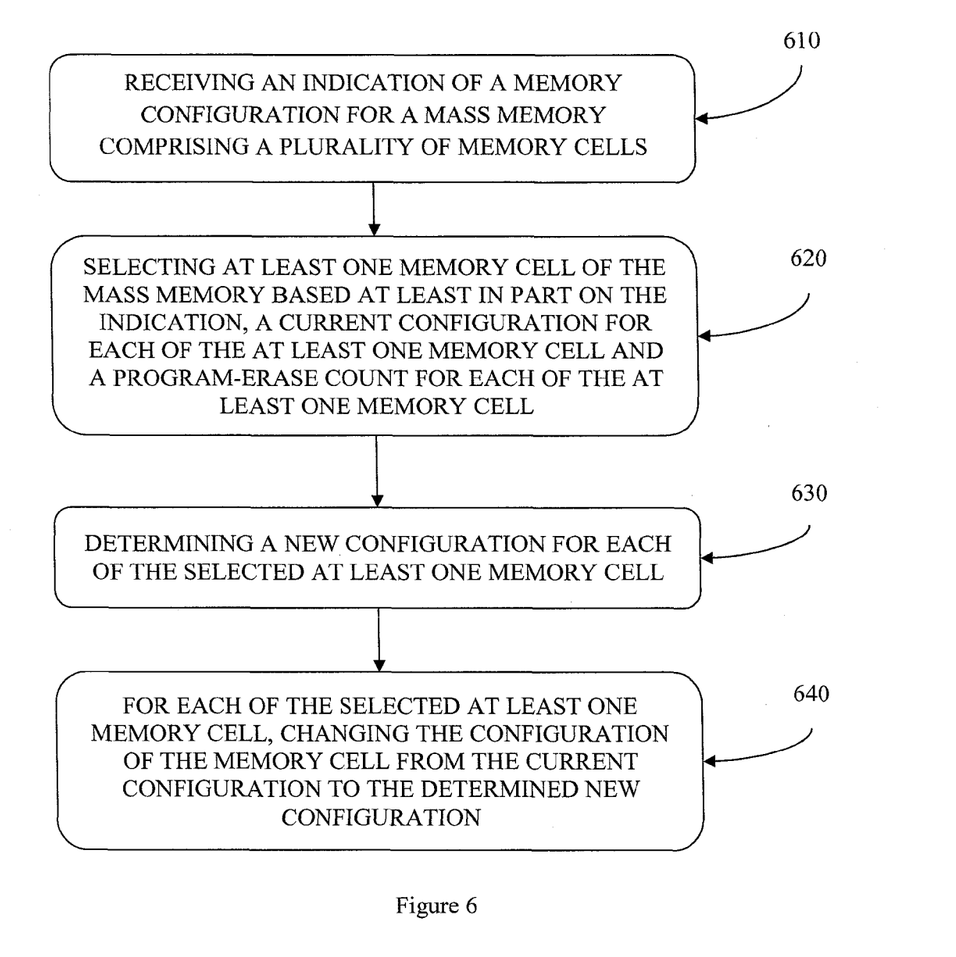
FIG. 6 is a logic flow diagram that illustrates the operation of an exemplary method, and a result of execution of computer program instructions embodied on a computer readable memory, in accordance with various exemplary embodiments of this invention.

FIG. 6 is a logic flow diagram that illustrates the operation of a method, and a result of execution of computer program instructions, in accordance with the exemplary embodiments of this invention. In accordance with these exemplary embodiments a method performs, at Block 610, a step of receiving an indication of a memory configuration for a mass memory comprising a plurality of memory cells is performed. Selecting at least one memory cell of the mass memory based at least in part on 1) the indication, 2) a current configuration for each of the at least one memory cell and 3) a program-erase count for each of the at least one memory cell is performed at Block 620. At Block 630 a new configuration for each of the selected at least one memory cell is determined. For each of the selected at least one memory cell, the configuration of the memory cell is changed from the current configuration to the determined new configuration at Block 640.

The various blocks shown in FIG. 6 may be viewed as method steps, and/or as operations that result from operation of computer program code, and/or as a plurality of coupled logic circuit elements constructed to carry out the associated function(s).

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

In an exemplary embodiment in accordance with this invention, a method is provided for enabling users to select a configuration balance for a memory device. The method includes receiving (e.g., by an input device) an indication of a memory configuration for a mass memory including two or more of memory cells. One or more memory cells of the mass memory are selected (e.g., by a processor) based at least in part on 1) the indication, 2) a current configuration for each of the one or more memory cells and 3) a program-erase count for each of the one or more memory cells. The method also includes determining (e.g., by a processor) a new configuration for each of the selected one or more memory cells. For each of the selected one or more memory cells, the configuration of the memory cell is changed (e.g., by a processor) from the current configuration to the determined new configuration.

In another exemplary embodiment of the method above, the indication includes a selection between density and reliability for the mass memory.

In a further exemplary embodiment of any one of the methods above, the mass memory is a NAND memory.

In another exemplary embodiment of any one of the methods above, the indication includes: a selection of an increase in density or a selection of an increase in reliability. Selecting the one or more memory cells may include, in response to the indication being a selection of an increase in density, selecting cells where the current configuration is multi-level and the program-erase count for the cell is relatively low; and, in response to the indication being a selection of an increase in reliability, selecting cells where the current configuration is single-level and the program-erase count for the cell is relatively high.

In a further exemplary embodiment of any one of the methods above, determining the new configuration includes determining a new maximum allowed number of program-erase cycles for the selected one or more memory cells.

In another exemplary embodiment of any one of the methods above, changing the configuration of the memory cell includes configuring the memory cell to be one of: a single-level cell and a multi-level cell.

In a further exemplary embodiment of any one of the methods above, receiving the indication of the memory configuration includes displaying a user interface and receiving, via the user interface, a selection between density and reliability.

In another exemplary embodiment of any one of the methods above, the method is performed by a memory controller of the mass memory.

In a further exemplary embodiment of any one of the methods above, the method is performed by a data processor of a host device, where the host device includes the mass memory.

In another exemplary embodiment in accordance with this invention, an apparatus is provided for enabling users to select a configuration balance for a memory device. The apparatus includes one or more processors; and one or more memories including computer program code, the one or more memories and the computer program code configured to, with the one or more processors, cause the apparatus to perform actions. The actions include receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The actions also include determining a new configuration for each of the selected one or more memory cells. For each of the selected one or more memory cells, the configuration of the memory cell is changed from the current configuration to the determined new configuration.

In a further exemplary embodiment of the apparatus above, the indication includes a selection between density and reliability for the mass memory.

In another exemplary embodiment of any one of the apparatus above, the mass memory is a NAND memory.

In a further exemplary embodiment of any one of the apparatus above, the indication includes: a selection of an increase in density or a selection of an increase in reliability. The at least one memory and the computer program code may be further configured to cause the apparatus, when the selecting the at least one memory cell, in response to the indication being a selection of an increase in density, to select cells where the current configuration is multi-level and the program-erase count for the cell is relatively low; and, in response to the indication being a selection of an increase in reliability, to select cells where the current configuration is single-level and the program-erase count for the cell is relatively high.

In another exemplary embodiment of any one of the apparatus above, the at least one memory and the computer program code may be further configured to cause the apparatus, when determining the new configuration, to determine a new maximum allowed number of program-erase cycles for the selected one or more memory cells.

In a further exemplary embodiment of any one of the apparatus above, the at least one memory and the computer program code may be further configured to cause the apparatus, when changing the configuration of the memory cell, to configure the memory cell to be one of: a single-level cell and a multi-level cell.

In another exemplary embodiment of any one of the apparatus above, the at least one memory and the computer program code may be further configured to cause the apparatus, when receiving the indication of the memory configuration to display a user interface and receiving, via the user interface, a selection between density and reliability.

In a further exemplary embodiment of any one of the apparatus above, the apparatus is embodied in a memory controller of the mass memory.

In another exemplary embodiment of any one of the apparatus above, the apparatus is embodied in a data processor of a host device, where the host device includes the mass memory.

In a further exemplary embodiment in accordance with this invention, a computer readable medium is provided for enabling users to select a configuration balance for a memory device. The computer readable medium is tangibly encoded with a computer program executable by a processor to perform actions. The actions include receiving an indication of a memory configuration for a mass memory including two or more of memory cells. One or more memory cells of the mass memory are selected based at least in part on 1) the indication, 2) a current configuration for each of the one or more memory cells and 3) a program-erase count for each of the one or more memory cells. The actions also include determining a new configuration for each of the selected one or more memory cells. For each of the selected one or more memory cells, the configuration of the memory cell is changed from the current configuration to the determined new configuration.

In another exemplary embodiment of the computer readable medium above, the indication includes a selection between density and reliability for the mass memory.

In a further exemplary embodiment of any one of the computer readable media above, the mass memory is a NAND memory.

In another exemplary embodiment of any one of the computer readable media above, the indication includes: a selection of an increase in density or a selection of an increase in reliability. Selecting the one or more memory cells may include, in response to the indication being a selection of an increase in density, selecting cells where the current configuration is multi-level and the program-erase count for the cell is relatively low; and, in response to the indication being a selection of an increase in reliability, selecting cells where the current configuration is single-level and the program-erase count for the cell is relatively high.

In a further exemplary embodiment of any one of the computer readable media above, determining the new configuration includes determining a new maximum allowed number of program-erase cycles for the selected one or more memory cells.

In another exemplary embodiment of any one of the computer readable media above, changing the configuration of the memory cell includes configuring the memory cell to be one of: a single-level cell and a multi-level cell.

In a further exemplary embodiment of any one of the computer readable media above, receiving the indication of the memory configuration includes displaying a user interface and receiving, via the user interface, a selection between density and reliability.

In another exemplary embodiment of any one of the computer readable media above, where the processor is a memory controller of the mass memory.

In a further exemplary embodiment of any one of the computer readable media above, where the processor is a data processor of a host device and the host device includes the mass memory.

In another exemplary embodiment of any one of the computer readable media above, the computer readable medium is a non-transitory computer readable medium (e.g., RAM, ROM, CD-ROM, flash memory, etc.).

In a further exemplary embodiment in accordance with this invention, an apparatus is provided for enabling users to select a configuration balance for a memory device. The apparatus includes means for receiving (e.g., an input device) an indication of a memory configuration for a mass memory including two or more of memory cells. Means for selecting (e.g., a processor) one or more memory cells of the mass memory based at least in part on 1) the indication, 2) a current configuration for each of the one or more memory cells and 3) a program-erase count for each of the one or more memory cells is also included. The apparatus also includes means for determining (e.g., a processor) a new configuration for each of the selected one or more memory cells. Means for changing (e.g., a processor), for each of the selected one or more memory cells, the configuration of the memory cell from the current configuration to the determined new configuration is also included.

In another exemplary embodiment of the apparatus above, the indication includes a selection between density and reliability for the mass memory.

In a further exemplary embodiment of any one of the apparatus above, the mass memory is a NAND memory.

In another exemplary embodiment of any one of the apparatus above, the indication includes: a selection of an increase in density or a selection of an increase in reliability. The selecting means may include means for selecting, in response to the indication being a selection of an increase in density, cells where the current configuration is multi-level and the program-erase count for the cell is relatively low; and means for selecting, in response to the indication being a selection of an increase in reliability, cells where the current configuration is single-level and the program-erase count for the cell is relatively high.

In a further exemplary embodiment of any one of the apparatus above, the determining means includes means for determining a new maximum allowed number of program-erase cycles for the selected one or more memory cells.

In another exemplary embodiment of any one of the apparatus above, the changing means includes means for configuring the memory cell to be one of: a single-level cell and a multi-level cell.

In a further exemplary embodiment of any one of the apparatus above, the receiving means includes means for displaying a user interface and means for receiving, via the user interface, a selection between density and reliability.

In another exemplary embodiment of any one of the apparatus above, the apparatus is embodied in a memory controller of the mass memory.

In a further exemplary embodiment of any one of the apparatus above, the apparatus is embodied in a data processor of a host device, where the host device includes the mass memory.

In a further exemplary embodiment in accordance with this invention, a method is provided for enabling users to select a configuration balance for a memory device. The method includes receiving, during operation of a mass memory, an indication of a memory configuration for the mass memory including a plurality of memory cells. The indication includes a selection between density and reliability for the mass memory. The mass memory includes management software configured to operate the mass memory in accordance with dynamic operation parameters. The method also includes adjusting the dynamic operation parameters based on the indication.

In another exemplary embodiment of the method above, the dynamic operation parameters include one or more maximum PE counts allowed for one or more memory cells. Adjusting the dynamic operation parameters includes increasing the one or more maximum PE counts allowed for one or more memory cells in response to the indication being a selection of an increase in the density (thus, density remains available as long as possible) and lowering the one or more maximum PE counts allowed for one or more memory cells in response to the indication being a selection of an increase in the reliability (thus, data retention will be improved; however, density may drop faster during extensive data writes).

In a further exemplary embodiment of any one of the methods above, the dynamic operation parameters include a maximum PE count allowed for one or more memory cells of the mass memory and the one or more memory cells are configured as a multi-level cell. The indication is a selection of an increase in the reliability. Adjusting the dynamic operation parameters includes reducing the maximum PE count in response to a PE count for one or more memory cells of the mass memory being relatively low (thus, capacity may be limited with no immediate impact on density), and reconfiguring the one or more memory cells as single-level cells in response to a PE count for one or more memory cells of the mass memory being relatively high (causing an immediate reduction in density). The PE count may be determined to be relatively low or high based on an absolute threshold or based on the maximum PE count allowed (for example, if the PE count represents more than 75% of the maximum allowed PE cycles the PE count may be considered high).

In another exemplary embodiment of any one of the methods above, the mass memory is a NAND memory.

In a further exemplary embodiment of any one of the methods above, the method also includes in response to the indication being a selection of an increase in the density, selecting memory cells where the current configuration is multi-level and the PE count for the memory cell is relatively low; and in response to the indication being a selection of an increase in the reliability, selecting memory cells where the current configuration is single-level and the PE count for the memory cell is relatively high; and determining a new configuration for each of the selected memory cells.

In another exemplary embodiment of any one of the methods above, the method also includes receiving an access request and accessing the mass memory in accordance to the adjusted dynamic operation parameters.

In a further exemplary embodiment of any one of the methods above, receiving the indication of the memory configuration includes displaying a user interface and receiving, via the user interface, the selection between the density and the reliability.

In another exemplary embodiment of any one of the methods above, the method also includes, in response to adjusting the dynamic operation parameters, determining updated device characteristics of the mass memory and displaying, via a user interface, the updated device characteristics.

In a further exemplary embodiment of any one of the methods above, the method is performed by a memory controller of the mass memory.

In another exemplary embodiment of any one of the methods above, the method is performed by a data processor of a host device, where the host device includes the mass memory.

In a further exemplary embodiment in accordance with this invention, an apparatus is provided for enabling users to select a configuration balance for a memory device. The apparatus includes one or more processors; and one or more memories including computer program code, the one or more memories and the computer program code configured to, with the one or more processors, cause the apparatus to perform actions. The actions include to receive, during operation of a mass memory, an indication of a memory configuration for the mass memory including a plurality of memory cells. The indication includes a selection between density and reliability for the mass memory. The mass memory includes management software configured to operate the mass memory in accordance with dynamic operation parameters. The actions also include to adjust the dynamic operation parameters based on the indication.

In another exemplary embodiment of the apparatus above, the dynamic operation parameters include one or more maximum PE counts allowed for one or more memory cells. In response to the indication being a selection of an increase in the density, when adjusting the dynamic operation parameters the one or more memory and the computer program code are further configured to cause the apparatus to increase the one or more maximum PE counts allowed for one or more memory cells. In response to the indication being a selection of an increase in the reliability, when adjusting the dynamic operation parameters the one or more memory and the computer program code are further configured to cause the apparatus to lower the one or more maximum PE counts allowed for one or more memory cells.

In a further exemplary embodiment of any one of the apparatus above, the dynamic operation parameters include a maximum PE count allowed for one or more memory cells of the mass memory and the one or more memory cells is configured as a multi-level cell. The indication is a selection of an increase in the reliability. In response to a PE count for one or more memory cells of the mass memory being relatively low, when adjusting the dynamic operation parameters the one or more memory and the computer program code are further configured to cause the apparatus to reduce the maximum PE count. In response to a PE count for one or more memory cells of the mass memory being relatively high, when adjusting the dynamic operation parameters the one or more memory and the computer program code are further configured to cause the apparatus to reconfigure the one or more memory cells as single-level cells.

In another exemplary embodiment of any one of the apparatus above, the one or more memory and the computer program code are further configured to cause the apparatus, in response to the indication being a selection of an increase in the density, to select memory cells where the current configuration is multi-level and the PE count for the memory cell is relatively low; in response to the indication being a selection of an increase in the reliability, to select memory cells where the current configuration is single-level and the PE count for the memory cell is relatively high; and to determine a new configuration for each of the selected memory cells.

In a further exemplary embodiment of any one of the apparatus above, the one or more memory and the computer program code are further configured to cause the apparatus, in response to adjusting the dynamic operation parameters, to determine updated device characteristics of the mass memory and to display, via a user interface, the updated device characteristics.

In another exemplary embodiment in accordance with this invention, a computer readable medium is provided for enabling users to select a configuration balance for a memory device. The computer readable medium is tangibly encoded with a computer program executable by a processor to perform actions. The actions include receiving, during operation of a mass memory, an indication of a memory configuration for the mass memory including a plurality of memory cells. The indication includes a selection between density and reliability for the mass memory. The mass memory includes management software configured to operate the mass memory in accordance with dynamic operation parameters. The actions also include adjusting the dynamic operation parameters based on the indication.

In a further exemplary embodiment of the computer readable medium above, the dynamic operation parameters include one or more maximum PE counts allowed for one or more memory cells. In response to the indication being a selection of an increase in the density, adjusting the dynamic operation parameters includes increasing the one or more maximum PE counts allowed for one or more memory cells; and in response to the indication being a selection of an increase in the reliability, adjusting the dynamic operation parameters includes lowering the one or more maximum PE counts allowed for one or more memory cells.

In another exemplary embodiment of any one of the computer readable media above, the dynamic operation parameters include a maximum PE count allowed for one or more memory cells of the mass memory and the one or more memory cells are configured as a multi-level cell. The indication is a selection of an increase in the reliability. In response to a PE count for one or more memory cells of the mass memory being relatively low, adjusting the dynamic operation parameters includes reducing the maximum PE count and in response to a PE count for one or more memory cells of the mass memory being relatively high, adjusting the dynamic operation parameters includes reconfiguring the one or more memory cells as single-level cells.

In further exemplary embodiment of any one of the computer readable media above, the computer readable medium is a non-transitory computer readable medium (e.g., RAM, ROM, CD-ROM, flash memory, etc.).

In an another exemplary embodiment in accordance with this invention, an apparatus is provided for enabling users to select a configuration balance for a memory device. The apparatus includes means for receiving, during operation of a mass memory, an indication of a memory configuration for the mass memory including a plurality of memory cells. The indication includes a selection between density and reliability for the mass memory. The mass memory includes management software configured to operate the mass memory in accordance with dynamic operation parameters. The apparatus also includes means for adjusting the dynamic operation parameters based on the indication.

In further exemplary embodiment of the apparatus above, the dynamic operation parameters include one or more maximum PE counts allowed for one or more memory cells, and where the adjusting means includes means for increasing the one or more maximum PE counts allowed for one or more memory cells in response to the indication being a selection of an increase in the density; and means for lowering the one or more maximum PE counts allowed for one or more memory cells in response to the indication being a selection of an increase in the reliability.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Further, the various names used for the described parameters (e.g., PE cycles, etc.) are not intended to be limiting in any respect, as these parameters may be identified by any suitable names.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method comprising:
receiving, during operation of a mass memory, an indication of a memory configuration for the mass memory, the mass memory comprising a plurality of memory cells,
where the indication comprises a selection between density and reliability for the mass memory, and
where the mass memory operates in accordance with dynamic operation parameters,
where the dynamic operation parameters comprise a maximum program-erase count allowed for at least one memory cell of the plurality of memory cells; and
adjusting the dynamic operation parameters based on the indication, the adjusting including one of increasing the maximum program-erase count responsive to the indication comprising a selection of density, and decreasing the maximum program-erase count responsive to the indication comprising a selection of reliability.

2. The method of claim 1, where:
the dynamic operation parameters comprise another maximum program-erase count allowed for at least one other memory cell of the plurality of memory cells and the at least one other memory cell is configured as a multi-level cell,
the indication is a selection of an emphasis on the reliability,
responsive to a program-erase count for the at least one other memory cell being relatively low, the adjusting the dynamic operation parameters further comprises reducing the other maximum program-erase count for the at least one other memory cell, and
responsive to the program-erase count for the at least one other memory cell being relatively high, the adjusting the dynamic operation parameters further comprises reconfiguring the at least one other memory cell as a single-level cell.

3. The method of claim 1, where the mass memory is a NAND memory.

4. The method of claim 3, further comprising:
responsive to the indication being a selection of an emphasis on the density, selecting as selected memory cells first memory cells of the plurality of memory cells that are currently configured as multi-level and for which the program-erase count is relatively low; and
responsive to the indication being a selection of an emphasis on the reliability, selecting as the selected memory cells second memory cells of the plurality of memory cells that are currently configured as single-level and for which the program-erase count is relatively high,
where the adjusting the dynamic operation parameters further comprises determining a new configuration of the selected memory cells.

5. The method of claim 1, further comprising receiving an access request, and accessing the mass memory in accordance to the adjusted dynamic operation parameters.

6. The method of claim 1, further comprising displaying a user interface, and receiving, via the user interface, the selection between the density and the reliability.

7. The method of claim 1, further comprising responsive to the adjusting the dynamic operation parameters, determining updated device characteristics of the mass memory and displaying, via a user interface, the updated device characteristics.

8. The method of claim 1, where the method is performed by a memory controller of the mass memory.

9. The method of claim 1, where the method is performed by a data processor of a host device, where the host device comprises the mass memory.

10. An apparatus, comprising at least one processor and at least one memory including computer program code, the at least one memory and the computer program code configured to, with the at least one processor, cause the apparatus to:
receive, during operation of a mass memory, an indication of a memory configuration for the mass memory comprising a plurality of memory cells,
where the indication comprises a selection between density and reliability for the mass memory,
where the mass memory is operated in accordance with dynamic operation parameters, and
where the dynamic operation parameters comprise a maximum program-erase count allowed for at least one memory cell of the plurality of memory cells; and
adjust the dynamic operation parameters based on the indication, including an increase in the maximum program-erase count responsive at least to the indication comprising a selection of density, and a decrease in the maximum program-erase count responsive at least to the indication comprising a selection of reliability.

11. The apparatus of claim 10, where:
the at least one memory cell is configured as a multi-level cell, and
the at least one memory and the computer program code are further configured to, with the at least one processor, cause the apparatus to:
reconfigure the at least one memory cell as a single-level cell, responsive to the indication comprising a selection of reliability and responsive to a program-erase count for the at least one memory cell being relatively high.

12. The apparatus of claim 10, where the at least one memory and the computer program code are further configured to, with the at least one processor, cause the apparatus to:
responsive to the indication comprising a selection of density, select as selected memory cells first memory cells that are currently configured as multi-level and for which the program-erase count is relatively low; and
responsive to the indication comprising a selection of reliability, select as the selected memory cells second memory cells that are currently configured as single-level and for which the program-erase count is relatively high; and
determine a new configuration for of the selected memory cells.

13. A computer-readable medium tangibly encoded with computer program code that is executable by a processor to perform actions comprising:
receiving, during operation of a mass memory, an indication of a memory configuration for the mass memory comprising a plurality of memory cells,
where the indication comprises a selection between density and reliability for the mass memory, and
where the mass memory is operated in accordance with dynamic operation parameters, and where the dynamic operation parameters comprise a maximum program-erase count allowed for at least one memory cell of the plurality of memory cells; and adjusting the dynamic operation parameters based on the indication, including increasing the maximum program-erase count responsive at least to the indication comprising a selection of density, and decreasing the maximum program-erase count responsive at least to the indication comprising a selection of reliability.

14. The computer-readable medium of claim 13, where:

the at least one memory cell is configured as a multi-level cell, and responsive at least to the indication comprising a selection of reliability and responsive to a program-erase count for the at least one memory cell being relatively high, the adjusting the dynamic operation parameters comprises reconfiguring the at least one memory cell as a single-level cell.

* * * * *